United States Patent
Lee et al.

(10) Patent No.: US 11,804,945 B2
(45) Date of Patent: Oct. 31, 2023

(54) RESET SYNCHRONIZING CIRCUIT AND GLITCHLESS CLOCK BUFFER CIRCUIT FOR PREVENTING START-UP FAILURE, AND IQ DIVIDER CIRCUIT

(71) Applicant: Samsung Electronics Co., Ltd., Suwon-si (KR)

(72) Inventors: Juyun Lee, Seoul (KR); Vishnu Kalyanamahadevi Gopalan Jawarlal, Bangalore (IN); Kang Jik Kim, Hwaseong-si (KR); Hyo Gyuem Rhew, Seoul (KR); Jae Hyun Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/669,262

(22) Filed: Feb. 10, 2022

(65) Prior Publication Data

US 2023/0138296 A1    May 4, 2023

(30) Foreign Application Priority Data

Nov. 2, 2021   (IN) .............................. 202141050276

(51) Int. Cl.
   *H03D 3/24*    (2006.01)
   *H04L 7/00*    (2006.01)
   *H03L 7/08*    (2006.01)

(52) U.S. Cl.
   CPC .......... *H04L 7/0016* (2013.01); *H03L 7/0807* (2013.01)

(58) Field of Classification Search
   CPC ...... H04L 7/0016; H03K 23/44; H03L 7/0807

USPC ......................................... 375/373, 326, 371
See application file for complete search history.

(56) References Cited

U.S. PATENT DOCUMENTS

| | | | |
|---|---|---|---|
| 6,085,342 A | 7/2000 | Marholev et al. |
| 7,671,633 B2 | 3/2010 | Kuhn |
| 7,948,815 B2 | 5/2011 | Song |
| 9,024,661 B2 | 5/2015 | Rooks |
| 9,360,883 B1 | 6/2016 | Barman et al. |
| 9,509,318 B2 | 11/2016 | Winemiller et al. |
| 10,157,087 B1 | 12/2018 | Abhishek et al. |

(Continued)

FOREIGN PATENT DOCUMENTS

| | | |
|---|---|---|
| KR | 20060059544 A | 6/2006 |
| KR | 100652565 B1 | 12/2006 |

OTHER PUBLICATIONS

Office Action in related Indian Patent Application No. 202141050276, dated Sep. 5, 2023.

*Primary Examiner* — Phuong Phu
(74) *Attorney, Agent, or Firm* — Muir Patent Law, PLLC

(57) ABSTRACT

A clock frequency divider circuit and a receiver are provided. The clock frequency divider circuit includes a reset retimer circuit configured to receive a reset signal and a clock signal, output a reset buffer signal of a differential signal pair obtained by buffering the reset signal, and output a reset synchronization signal obtained by synchronizing the reset signal with the clock signal, a clock buffer circuit configured to receive the clock signal and the reset synchronization signal and output a clock buffer signal of a differential signal pair obtained by buffering the clock signal, and an IQ divider circuit configured to output first through fourth output signals having different phases based on the reset buffer signal and the clock buffer signal.

19 Claims, 11 Drawing Sheets

(56) References Cited

U.S. PATENT DOCUMENTS

| | | |
|---|---|---|
| 2003/0193355 A1 | 10/2003 | Leifso et al. |
| 2007/0159210 A1 | 7/2007 | Sato |
| 2014/0103984 A1* | 4/2014 | Goldblatt ............... H03K 23/44 327/254 |

* cited by examiner

RESET SYNCHRONIZING CIRCUIT AND GLITCHLESS CLOCK BUFFER CIRCUIT FOR PREVENTING START-UP FAILURE, AND IQ DIVIDER CIRCUIT

CROSS-REFERENCE TO RELATED APPLICATION(S)

This U.S. non-provisional patent application claims priority under 35 U.S.C. § 119 to Indian Patent Application No. 202141050276, filed on Nov. 2, 2021, in the Indian Patent Office, the disclosure of which is incorporated in its entirety by reference herein.

BACKGROUND

1. Field

The present disclosure relates to a clock frequency divider circuit.

2. Description of the Related Art

In a transmission/reception system, a transmitter may transmit data to a receiver, and the receiver may recover the data received from the transmitter and output the recovered data. In this process, the transmitter may receive a clock signal having a constant frequency and transmit extracted data to the receiver based on the toggle timing of the clock signal.

In order to recover data received from the transmitter, the receiver may recover the data through a clock signal embedded in the data or may recover the data based on a clock signal received from an external source.

In the latter case, a clock divided signal obtained by modulating a clock signal through a divider circuit may be used to recover data. In this process, when the clock signal provided to the divider circuit is not synchronized with an enable signal for operating the divider circuit, a glitch may occur. Accordingly, the divider circuit may be desired to operate properly without the glitch.

SUMMARY

Aspects of the present disclosure provide a clock frequency divider circuit having improved operating performance by preventing the occurrence of glitches in a transmission/reception system operating at high speed.

Aspects of the present disclosure also provide a receiver having improved operating performance by preventing the occurrence of glitches in a transmission/reception system operating at high speed.

According to an aspect of the present disclosure, there is provided a clock frequency divider circuit, including a reset retimer circuit configured to receive a reset signal and a clock signal, output a reset buffer signal of a differential signal pair obtained by buffering the reset signal, and output a reset synchronization signal obtained by synchronizing the reset signal with the clock signal, a clock buffer circuit configured to receive the clock signal and the reset synchronization signal and output a clock buffer signal of a differential signal pair obtained by buffering the clock signal, and an IQ divider circuit configured to output first through fourth output signals having different phases based on the reset buffer signal and the clock buffer signal.

According to another aspect of the present disclosure, there is provided a clock frequency divider circuit, including a reset retimer circuit configured to receive a clock signal transitioning between a first level and a second level higher than the first level and a reset signal and output a reset buffer signal and a reset synchronization signal, a clock buffer circuit configured to receive the clock signal and the reset synchronization signal and output a clock buffer signal, and an IQ divider circuit configured to output first through fourth output signals having different phases based on the reset buffer signal and the clock buffer signal. The reset signal transitions from the first level to the second level at a first time point, the reset buffer signal transitions from the first level to the second level at a second time point after the first time point at which the reset signal transitions from the first level to the second level, and the reset synchronization signal transitions from the first level to the second level in synchronization with the clock signal at a third time point at which the clock signal transitions from the first level to the second level.

According to another aspect of the present disclosure, there is provided a receiver, including a clock and data recovery (CDR) unit configured to receive data from a transmitter and output recovered data based on the received data and first through fourth output signals. The first through fourth output signals are provided from a clock frequency divider circuit configured to receive a reset signal and a clock signal, generate a reset synchronization signal synchronized with the clock signal, generate a reset buffer signal by buffering the reset signal, generate a clock buffer signal by buffering the clock signal, and output the first through fourth output signals based on the reset buffer signal and the clock buffer signal.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, embodiments according to the technical spirit of the present disclosure will be described with reference to the accompanying drawings.

Figure 1:
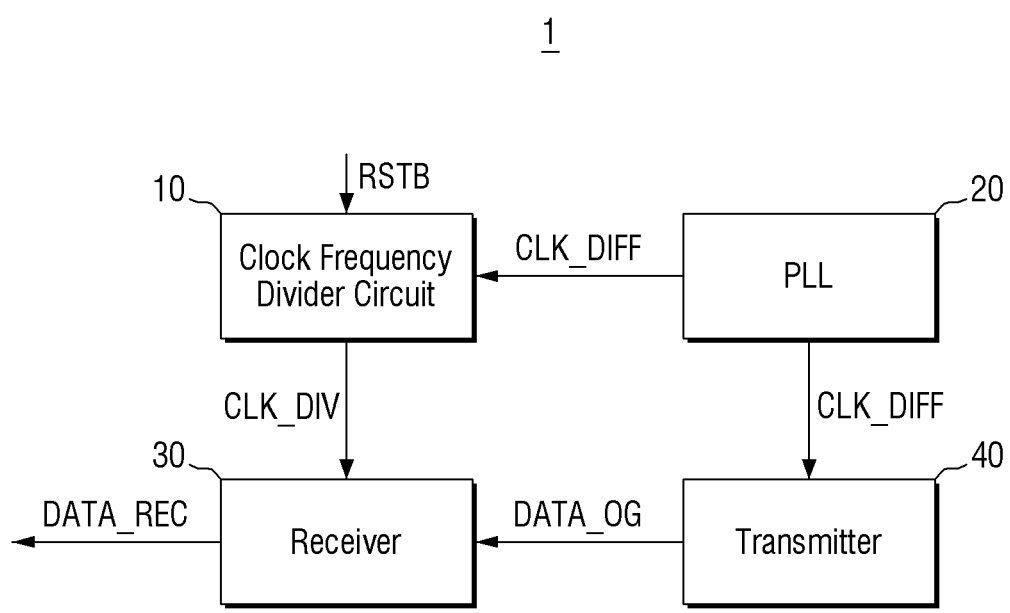
FIG. 1 is a block diagram of a transmission/reception system according to example embodiments.

FIG. 1 is a block diagram of a transmission/reception system according to example embodiments.

Referring to FIG. 1, the transmission/reception system 1 may include a clock frequency divider circuit 10, a phase locked loop (PLL) 20, a receiver 30, and a transmitter 40. High-speed interfaces may use the transmission/reception system 1 of FIG. 1.

In example embodiments, a memory device and a memory controller may communicate with each other based on one of various interfaces such as low power DDR (LPDDR) interface, universal serial bus (USB), modular multilevel converter (MMC), peripheral component interconnect (PCI), PCI express (PCI-E), advanced technology attachment (ATA), serial ATA (SATA), parallel ATA (PATA), small computer system interface (SCSI), enhanced standard (small/system) device interface (ESDI), and integrated drive electronics (IDE). For example, one of the above various interfaces may use the transmission/reception system 1 of FIG. 1.

The clock frequency divider circuit 10 may receive a reset signal RSTB that turns on the clock frequency divider circuit 10 and may receive a clock signal CLK_DIFF of a differential signal pair from the PLL 20. In some embodiments, the clock frequency divider circuit 10 may also receive a reset signal RST. The reset signal RSTB and the reset signal RST may be signals of a differential pair having opposite phases. The clock frequency divider circuit 10 may output an output signal CLK_DIV based on the received reset signal RSTB and clock signal CLK_DIFF. In some embodiments, the output signal CLK_DIV may include first through fourth output signals.

The reset signal RSTB or RST may be provided from a controller or a control circuit of The PLL 20 may provide the clock signal CLK_DIFF of the differential signal pair to the clock frequency divider circuit 10 and the transmitter 40. The PLL 20 may include an oscillator to output the clock signal CLK_DIFF having a constant frequency, but the present disclosure is not limited thereto.

The transmitter 40 may receive the clock signal CLK_DIFF from the PLL 20. The transmitter 40 may transmit data DATA_OG to the receiver 30 based on the received clock signal CLK_DIFF.

The receiver 30 may receive the data DATA_OG from the transmitter 40 and receive the output signal CLK_DIV from the clock frequency divider circuit 10. The receiver 30 may recover the received data DATA_OG based on the received output signal CLK_DIV and output the recovered data DATA_REC.

Figure 2:
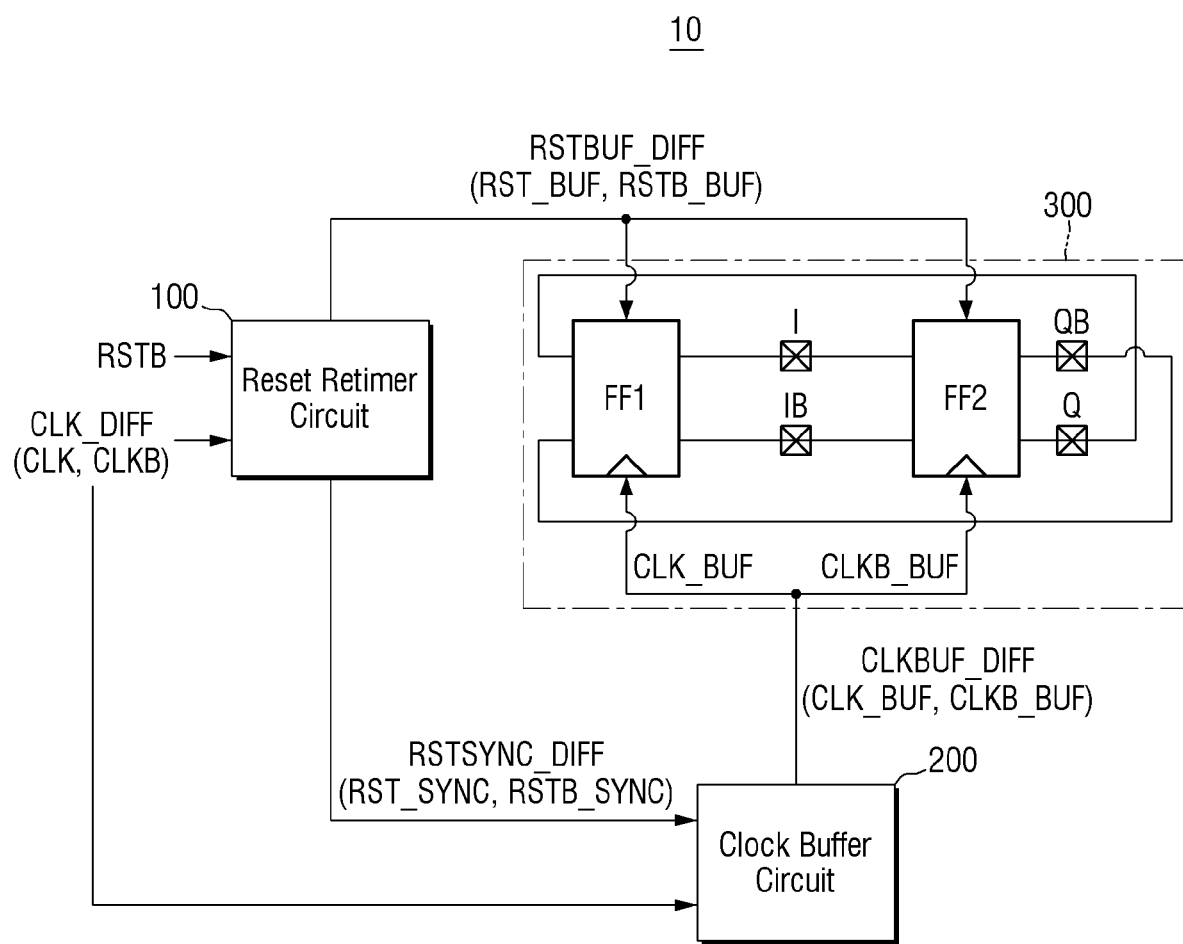
FIG. 2 is a block diagram of a clock frequency divider circuit according to example embodiments.

FIG. 2 is a block diagram of the clock frequency divider circuit according to example embodiments.

Referring to FIG. 2, the clock frequency divider circuit 10 may include a reset retimer circuit 100, a clock buffer circuit 200, and an IQ divider circuit 300.

The reset retimer circuit 100 may receive the reset signal RSTB and the clock signal CLK_DIFF. Here, the clock signal CLK_DIFF may include a first clock signal CLK and a second clock signal CLKB. The first clock signal CLK and the second clock signal CLKB may be signals of a differential pair having opposite phases.

The reset retimer circuit 100 may output a reset buffer signal RSTBUF_DIFF and a reset synchronization signal RSTSYNC_DIFF based on the received reset signal RSTB and clock signal CLK_DIFF.

The reset buffer signal RSTBUF_DIFF may include a first reset buffer signal RST_BUF and a second reset buffer signal RSTB_BUF. The first reset buffer signal RST_BUF and the second reset buffer signal RSTB_BUF may be signals of a differential pair having opposite phases.

The reset synchronization signal RSTSYNC_DIFF may include a first reset synchronization signal RST_SYNC and a second reset synchronization signal RSTB_SYNC. The first reset synchronization signal RST_SYNC and the second reset synchronization signal RSTB_SYNC may be signals of a differential pair having opposite phases. The reset synchronization signal RSTSYNC_DIFF may be a signal synchronized with the received clock signal CLK_DIFF. Specific details will be described later.

The reset retimer circuit 100 may provide the reset buffer signal RSTBUF_DIFF to the IQ divider circuit 300 and provide the reset synchronization signal RSTSYNC_DIFF to the clock buffer circuit 200.

The clock buffer circuit 200 may receive the clock signal CLK_DIFF and the reset synchronization signal RSTSYNC_DIFF. The clock buffer circuit 200 may output a clock buffer signal CLKBUF_DIFF based on the received clock signal CLK_DIFF and reset synchronization signal RSTSYNC_DIFF.

The clock buffer signal CLKBUF_DIFF may include a first clock buffer signal CLK_BUF and a second clock buffer signal CLKB_BUFF. The first clock buffer signal CLK_BUF and the second clock buffer signal CLKB_BUF may be signals of a differential pair having opposite phases. The clock buffer signal CLKBUF_DIFF may be a signal obtained by buffering the clock signal CLK_DIFF. Specific details will be described later.

The IQ divider circuit 300 may include two flip-flops FF1 and FF2 and four output terminals I, Q, IB, and QB existing between the two flip-flops FF1 and FF2. The IQ divider circuit 300 may receive the reset buffer signal RSTBUF_DIFF and the clock buffer signal CLKBUF_DIFF.

The IQ divider circuit 300 may output first through fourth output signals through the output terminals I, Q, IB, and QB based on the received reset buffer signal RSTBUF_DIFF and clock buffer signal CLKBUF_DIFF. For example, the output terminal I may output the first output signal, the output terminal Q may output the second output signal, the output terminal IB may output the third output signal, and the output terminal QB may output the fourth output signal.

Here, the first through fourth output signals of the IQ divider circuit 300 may have different phases. For example, the first through fourth output signals may have a relationship in which they sequentially have a phase difference of 90 degrees. Specifically, the first output signal may toggle at a falling edge of a clock signal, the second output signal may toggle at a rising edge of the clock signal, the third output signal may have a phase opposite to that of the first output signal, and the fourth output signal may have a phase opposite to that of the second output signal.

Figure 3:
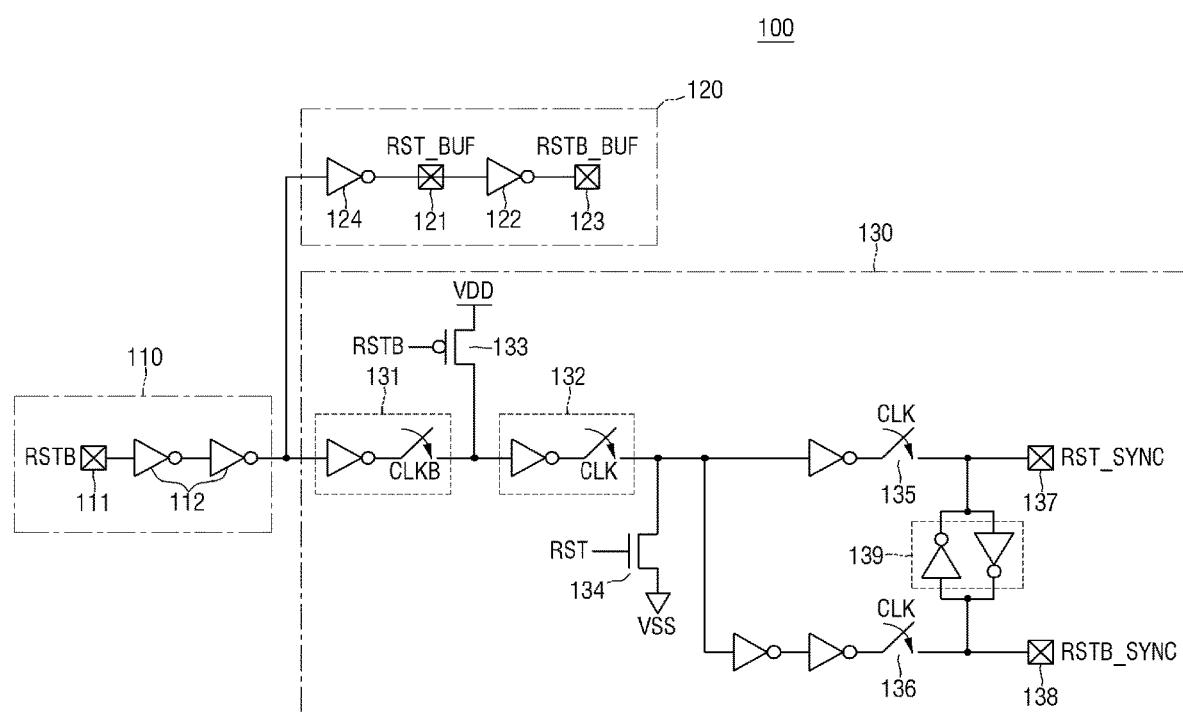
FIG. 3 is a circuit diagram of a reset retimer circuit included in the clock frequency divider circuit of FIG. 2 according to example embodiments.

FIG. 3 is a circuit diagram of the reset retimer circuit included in the clock frequency divider circuit of FIG. 2 according to example embodiments.

Referring to FIG. 3, the reset retimer circuit 100 may include a reset signal input unit 110, a reset buffer signal output unit 120, and a reset synchronization signal output unit 130. As is traditional in the field of the disclosed technology, features and embodiments are described, and illustrated in the drawings, in terms of functional units. Those skilled in the art will appreciate that these units are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the units being implemented by microprocessors or similar, they may be programmed using software (e.g., microcode) to perform various functions discussed herein and may optionally be driven by firmware and/or software. Alternatively, each unit may be implemented by dedicated hardware, or as a combination of dedicated hardware to perform some functions and a processor (e.g., one or more programmed microprocessors and associated circuitry) to perform other functions. Also, each unit of the embodiments may be physically separated into two or more interacting and discrete units without departing from the scope of the inventive concepts. Further, the units of the embodiments may be physically combined into more complex units without departing from the scope of the inventive concepts.

The reset signal input unit 110 may include a reset signal input terminal 111 and a plurality of inverters 112.

The reset signal input terminal 111 may receive the reset signal RSTB.

The inverters 112 may receive the reset signal RSTB and function as buffers. In FIG. 3, the inverters 112 include two inverters. However, the present disclosure is not limited thereto, and the inverters 112 may also include other numbers of inverters.

The reset buffer signal output unit 120 may include a first reset buffer signal output terminal 121, a first inverter 124, a second inverter 122, and a second reset buffer signal output terminal 123.

Each of the first reset buffer signal output terminal 121 and the second reset buffer signal output terminal 123 may output a reset buffer signal. For example, the first reset buffer signal output terminal 121 may output the first reset buffer signal RST_BUF, and the second reset buffer signal output terminal 123 may output the second reset buffer signal RSTB_BUF having a phase opposite to that of the first reset buffer signal RST_BUF.

The first inverter 124 may have an input terminal connected to an output terminal of the reset signal input unit 110 and an output terminal connected to the first reset buffer signal output terminal 121. The second inverter 122 may exist between the first reset buffer signal output terminal 121 and the second reset buffer signal output terminal 123 so that the first reset buffer signal output terminal 121 and the second reset buffer signal output terminal 123 output reset buffer signals having opposite phases. Accordingly, although one inverter 122 exists in FIG. 3, the present disclosure is not limited thereto, and an odd number greater than 1 of inverters may also exist so that the first reset buffer signal output terminal 121 and the second reset buffer signal output terminal 123 output reset buffer signals having opposite phases.

The reset synchronization signal output unit 130 may include first and second flip-flops 131 and 132, first and second switching transistors 133 and 134, a first switch 135, a second switch 136, a first reset synchronization signal output terminal 137, a second reset synchronization signal output terminal 138, and a latch 139.

Each of the first and second flip-flops 131 and 132 may include an inverter and a switch. The switch of each of the first and second flip-flops 131 and 132 may operate in synchronization with the first clock signal CLK or the second clock signal CLKB.

The first and second switching transistors 133 and 134 may be connected to output terminals of the first and second flip-flops 131 and 132, respectively. The first and second switching transistors 133 and 134 may be gated by the reset signals RSTB and RST of a differential signal pair to operate as switches.

The first switch 135 may be connected to an inverter connected to an output terminal of a second flip-flop 132. The first switch 135 may operate in synchronization with the first clock signal CLK. The first switch 135 may output the first reset synchronization signal RST_SYNC in synchronization with the first clock signal CLK.

The second switch 136 may be connected to an inverter connected to an inverter connected to the output terminal of the second flip-flop 132. The second switch 136 may operate in synchronization with the first clock signal CLK. The second switch 136 may output the second reset synchronization signal RSTB_SYNC in synchronization with the first clock signal CLK.

The first reset synchronization signal output terminal 137 may be connected to the first switch 135 to output the first reset synchronization signal RST_SYNC.

The second reset synchronization signal output terminal 138 may be connected to the second switch 136 to output the second reset synchronization signal RSTB_SYNC.

The latch 139 may be connected between the first reset synchronization signal output terminal 137 and the second reset synchronization signal output terminal 138. When the first switch 135 and the second switch 136 are open, the latch 139 may operate such that the first reset synchronization signal output terminal 137 and the second reset synchronization signal output terminal 138 output signals of a constant level.

In FIG. 3, one inverter exists at an input terminal of the first switch 135, and two inverters exist at an input terminal of the second switch 136 so that reset synchronization signals having opposite phases are output. However, the present disclosure is not limited thereto, and other numbers of inverters may also be included.

Figure 4:
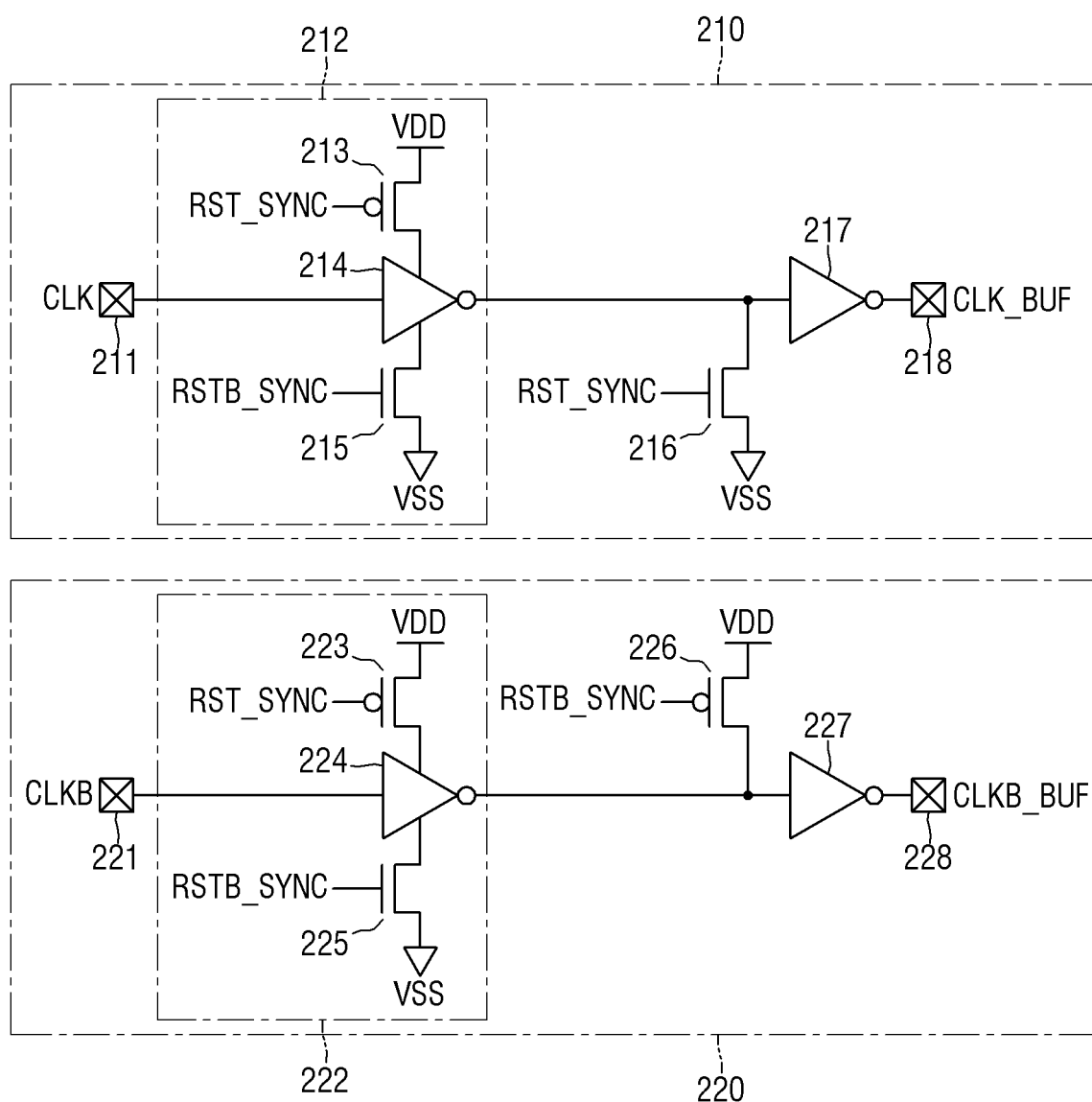
FIG. 4 is a circuit diagram of a clock buffer circuit included in the clock frequency divider circuit of FIG. 2 according to example embodiments.

FIG. 4 is a circuit diagram of the clock buffer circuit included in the clock frequency divider circuit of FIG. 2 according to example embodiments.

The clock buffer circuit 200 may include a first clock buffer circuit 210 outputting the first clock buffer signal CLK_BUF and a second clock buffer circuit 220 outputting the second clock buffer signal CLKB_BUF. Here, the first clock buffer circuit 210 and the second clock buffer circuit 220 have substantially the same configuration, and thus only the first clock buffer circuit 210 will be described.

The first clock buffer circuit 210 may include a first clock signal input terminal 211, a first tristate buffer 212, a first transistor 216, a first inverter 217, and a first clock buffer signal output terminal 218.

The first clock signal input terminal 211 may receive the first clock signal CLK.

The first tristate buffer 212 may include a second inverter 214, a second transistor 213, and a third transistor 215.

An end of the second transistor 213 may receive a driving voltage VDD. The other end of the second transistor 213 may be connected to the second inverter 214. The second transistor 213 may be gated by the first reset synchronization signal RST_SYNC. In some embodiments, the second transistor 213 may be, but is not limited to, a p-channel metal oxide semiconductor (PMOS) transistor.

An end of the third transistor 215 may be connected to the second inverter 214. The other end of the third transistor 215 may receive a ground voltage VSS. The third transistor 215 may be gated by the second reset synchronization signal RSTB_SYNC. In some embodiments, the third transistor 215 may be, but is not limited to, an n-channel metal oxide semiconductor (NMOS) transistor.

The second inverter 214 may be connected to the second transistor 213 and the third transistor 215. The second inverter 214 may operate as an inverter when the second transistor 213 and the third transistor 215 are gated by the first reset synchronization signal RST_SYNC and the second reset synchronization signal RSTB_SYNC, respectively. For example, the second inverter 214 may be in a floating state when the second transistor 213 and the third transistor 215 are not gated by the first reset synchronization signal RST_SYNC and the second reset synchronization signal RSTB_SYNC, respectively.

An end of the first transistor 216 may be connected to an output terminal of the first tristate buffer 212 and an input terminal of the first inverter 217. The other end of the first transistor 216 may receive the ground voltage VSS. The first transistor 216 may be gated by the first reset synchronization signal RST_SYNC. In some embodiments, the first transistor 216 may be, but is not limited to, an NMOS transistor.

The first inverter 217 may receive a signal output from the first tristate buffer 212 and operate as an inverter. Therefore, when the first tristate buffer 212 operates as an inverter, the first tristate buffer 212 and the first inverter 217 may operate as buffers.

The first clock buffer signal output terminal 218 may output the first clock buffer signal CLK_BUF. The first block buffer signal output terminal 218 may provide the first clock buffer signal CLK_BUF to the IQ divider circuit.

Figure 5:
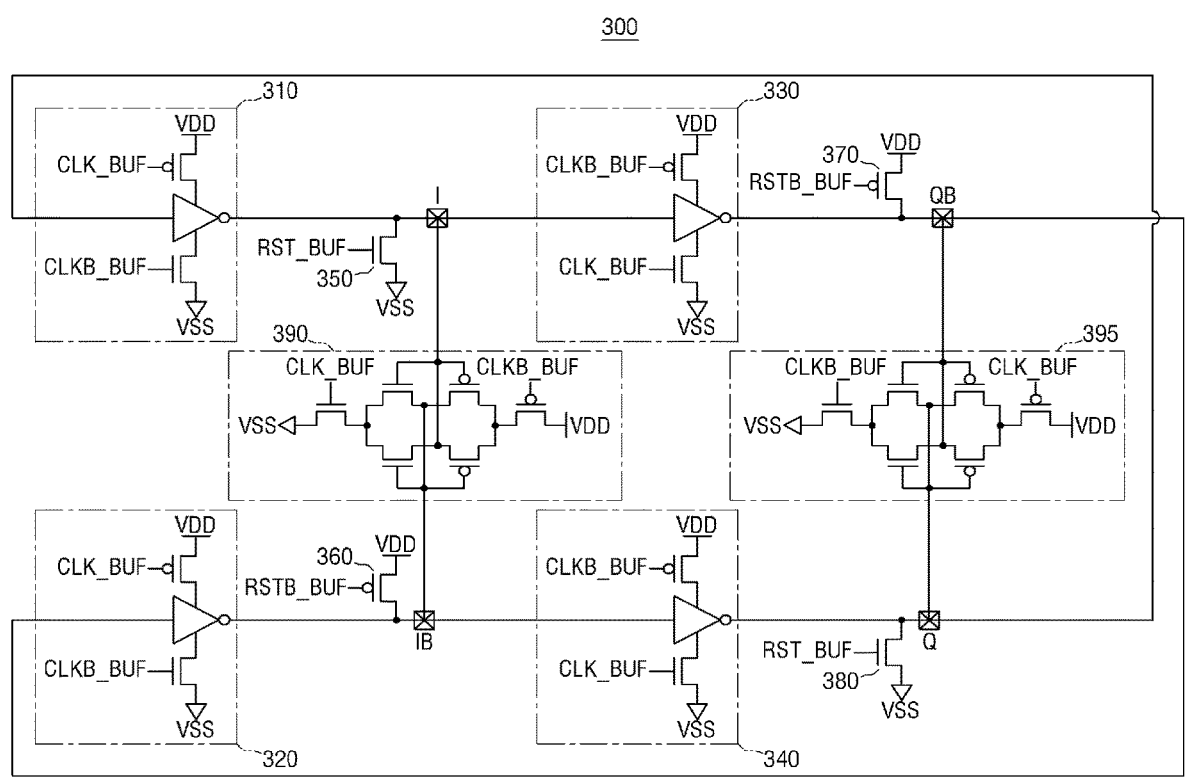
FIG. 5 is a circuit diagram of an IQ divider circuit included in the clock frequency divider circuit of FIG. 2 according to example embodiments.

FIG. 5 is a circuit diagram of the IQ divider circuit included in the clock frequency divider circuit of FIG. 2 according to example embodiments.

The IQ divider circuit 300 may include third through sixth tristate buffers 310, 320, 330 and 340, third through sixth switching transistors 350, 360, 370 and 380, first and second latches 390 and 395, and the first through fourth output terminals I, Q, IB, and QB.

The third through sixth tristate buffers 310, 320, 330 and 340 have substantially the same configuration and are substantially the same as the first tristate buffer 212 of FIG. 4, and thus a detailed description thereof will be omitted below.

The third and sixth switching transistors 350 and 380 are substantially the same, and thus only the third switching transistor 350 will be described.

An end of the third switching transistor 350 may be connected to an output terminal of the third tristate buffer 310 and the output terminal I which outputs the first output signal. The other end of the third switching transistor 350 may receive the ground voltage VSS. The third switching transistor 350 may be gated by the first reset buffer signal RST_BUF. In some embodiments, the third switching transistor 350 may be, but is not limited to, an NMOS transistor.

The fourth and fifth switching transistors 360 and 370 are substantially the same, and thus only the fourth switching transistor 360 will be described.

An end of the fourth switching transistor 360 may receive the driving voltage VDD. The other end of the fourth switching transistor 360 may be connected to an output terminal of the fourth tristate buffer 320 and the output terminal IB which outputs the third output signal. The fourth switching transistor 360 may be gated by the second reset buffer signal RSTB_BUF. In some embodiments, the fourth switching transistor 360 may be, but is not limited to, a PMOS transistor.

The first through fourth output terminals I, Q, IB, and QB may output the first through fourth output signals. Specifically, the output terminal I may output the first output signal, the output terminal Q may output the second output signal, the output terminal IB may output the third output signal, and the output terminal QB may output the fourth output signal. Herein, for convenience of description, the terms of the first through fourth output terminals I, Q, IB, and QB and first through fourth output signals I, Q, IB, and QB may be used interchangeably.

Here, the first through fourth output signals may have different phases. For example, the first through fourth output signals may have a relationship in which they sequentially have a phase difference of 90 degrees. Specifically, the first output signal may toggle at a falling edge of a clock signal, the second output signal may toggle at a rising edge of the clock signal, the third output signal may have a phase opposite to that of the first output signal, and the fourth output signal may have a phase opposite to that of the second output signal.

Figure 6:
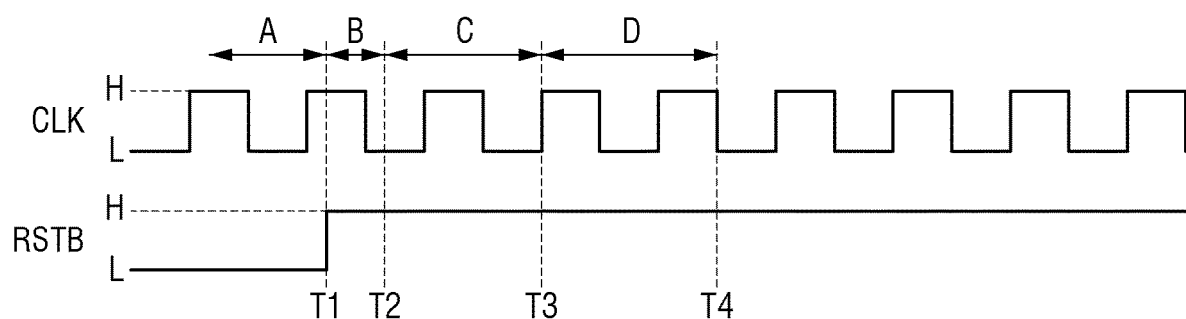
FIG. 6 is a timing diagram for explaining an operation of the clock frequency divider circuit according to example embodiments.

FIG. 6 is a timing diagram for explaining an operation of the clock frequency divider circuit according to example embodiments.

Referring to FIG. 6, the clock signal CLK and the reset signal RSTB may transition between a first level L corresponding to a low level and a second level H corresponding to a high level.

The clock signal CLK having a constant frequency may be output from the PLL 20 of FIG. 1.

The reset signal RSTB may transition from the first level L to the second level H at a first time T1 (hereinafter, the "time" may also refer to "time point.") at which the clock frequency divider circuit operates. For example, the reset signal RSTB may correspond to an enable signal. Therefore, a period A before the first time T1 may correspond to a period before the clock frequency divider circuit operates, and periods B, C and D may correspond to periods in which the clock frequency divider circuit operates.

As illustrated in FIG. 6, the reset signal RSTB may not be synchronized with the clock signal CLK. Specifically, the first time T1 at which the reset signal RSTB transitions from the first level to the second level may not be the same as the time at which the clock signal CLK toggles.

When the reset signal RSTB and the clock signal CLK are not synchronized as described above, a short glitch having a width smaller than that of the clock signal CLK may occur in a period B between the first time T1 and a second time T2. Due to the glitch, a tristate buffer included in the IQ divider circuit may be unable to sufficiently drive the phase of an output signal while operating as an inverter. When the phase of the output signal is not sufficiently driven, a plurality of output terminals may output signals having a constant level without transitioning between the first level L and the second level H.

Specifically, referring to FIG. 5, when a first clock signal having the second level H is provided to the fifth tristate buffer 330 as the first clock buffer signal CLK_BUF and a second clock signal having the first level L is provided to the fifth tristate buffer 330 as the second clock buffer signal CLKB_BUF, the fifth tristate buffer 330 may operate as an inverter. However, since the first clock signal and the second clock signal are instantaneously generated, the fifth tristate buffer 330 may not be sufficiently driven. Accordingly, the phase of a signal provided to the output terminal QB may have a constant level without being reversed.

Therefore, the clock frequency divider circuit according to the embodiments of the present disclosure may provide the IQ divider circuit with a clock buffer signal obtained by buffering a clock signal based on a reset synchronization signal synchronized with the clock signal. Accordingly, this may remove a glitch, and thus the output terminals of the IQ divider circuit may normally output the output signals having different phases.

Figure 7:
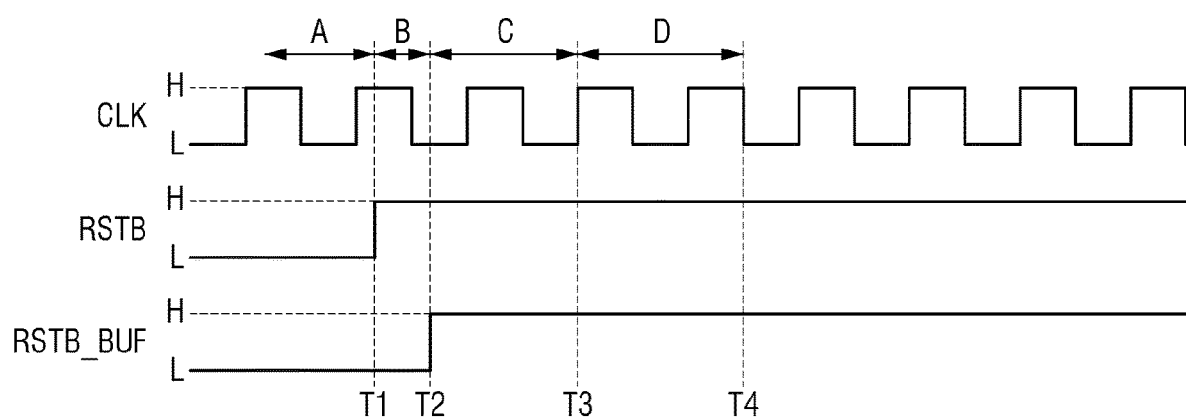
FIG. 7 is a timing diagram for explaining the operation of the clock frequency divider circuit according to example embodiments.

FIG. 7 is a timing diagram for explaining the operation of the clock frequency divider circuit according to example embodiments.

Referring to FIG. 7, after the reset signal RSTB transitions from the first level L to the second level H at the first time T1, the second reset buffer signal RSTB_BUF may transition from the first level L to the second level H at the second time T2.

Specifically, referring to FIG. 3, since an even number of inverters exist between the reset signal input terminal 111 and the second reset buffer signal output terminal 123, the second reset buffer signal RSTB_BUF may transition from the first level L to the second level H in response to the transition of the reset signal RSTB from the first level L to the second level H.

Since the second reset buffer signal RSTB_BUF is output via an additional element such as an inverter after the reset signal RSTB is input, it may transition after being delayed by the period B. In addition, like the reset signal RSTB, the second reset buffer signal RSTB_BUF may be a signal not synchronized with the first clock signal CLK.

Figure 8:
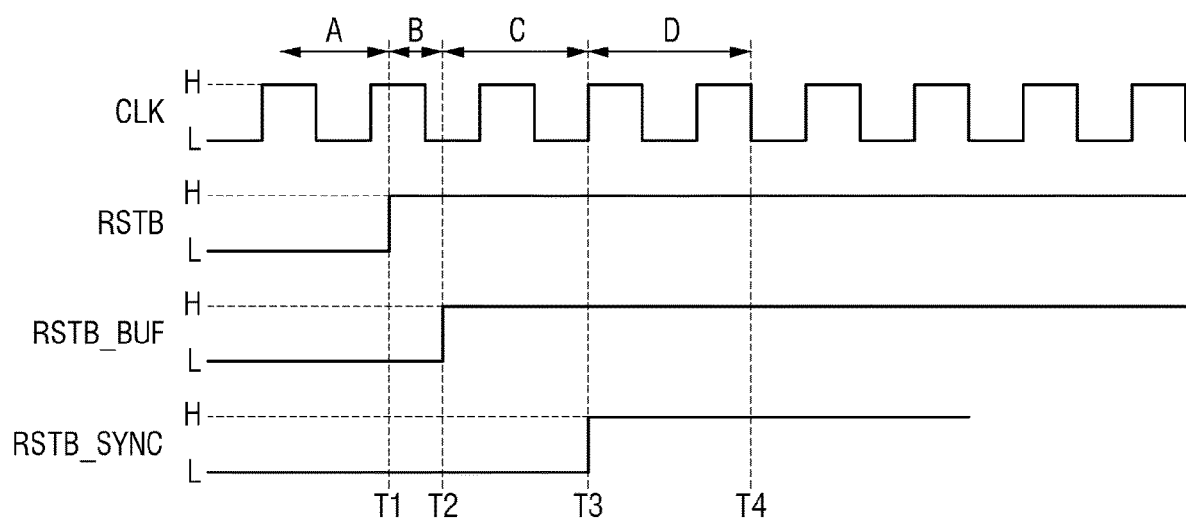
FIG. 8 is a timing diagram for explaining the operation of the clock frequency divider circuit according to example embodiments.

FIG. 8 is a timing diagram for explaining the operation of the clock frequency divider circuit according to example embodiments.

Referring to FIG. 8, after the second reset buffer signal RSTB_BUF transitions to the second level H at the second time T2, the second reset synchronization signal RSTB_SYNC may transition from the first level L to the second level H at a third time T3. The third time T3 may correspond to a rising edge time of the first clock signal CLK, and the second reset synchronization signal RSTB_SYNC may transition from the first level L to the second level H in synchronization with a rising edge of the first clock signal CLK.

Specifically, referring also to FIG. 3, when the reset signal RSTB corresponds to the first level L in the period A, a second switching transistor 134 may be gated to pull down a node connected to an output terminal of the second flip-flop 132. Accordingly, the second reset synchronization signal output terminal 138 may output the second reset synchronization signal RSTB_SYNC of the first level L.

When the reset signal RSTB transitions from the first level L to the second level H at the first time T1, both the first and second switching transistors 133 and 134 may be turned off. Accordingly, a node to which the second switching transistor 134 and the second flip-flop 132 are connected may have a high level. Accordingly, the second reset synchronization signal output terminal 138 may output the second reset synchronization signal RSTB_SYNC of the second level H.

In addition, the second reset synchronization signal output terminal 138 may be connected to the second switch 136 synchronized with the first clock signal CLK to output the second reset synchronization signal RSTB_SYNC synchronized with the first clock signal CLK. Even if the second reset synchronization signal output terminal 138 is not connected to the second switch 136 by the first clock signal CLK, the second reset synchronization signal RSTB_SYNC having a constant level may be output by the latch 139. In addition, the second reset synchronization signal RSTB_SYNC may transition after being delayed by the period C after the second reset buffer signal RSTB_BUF transitions at the second time T2.

Figure 9:
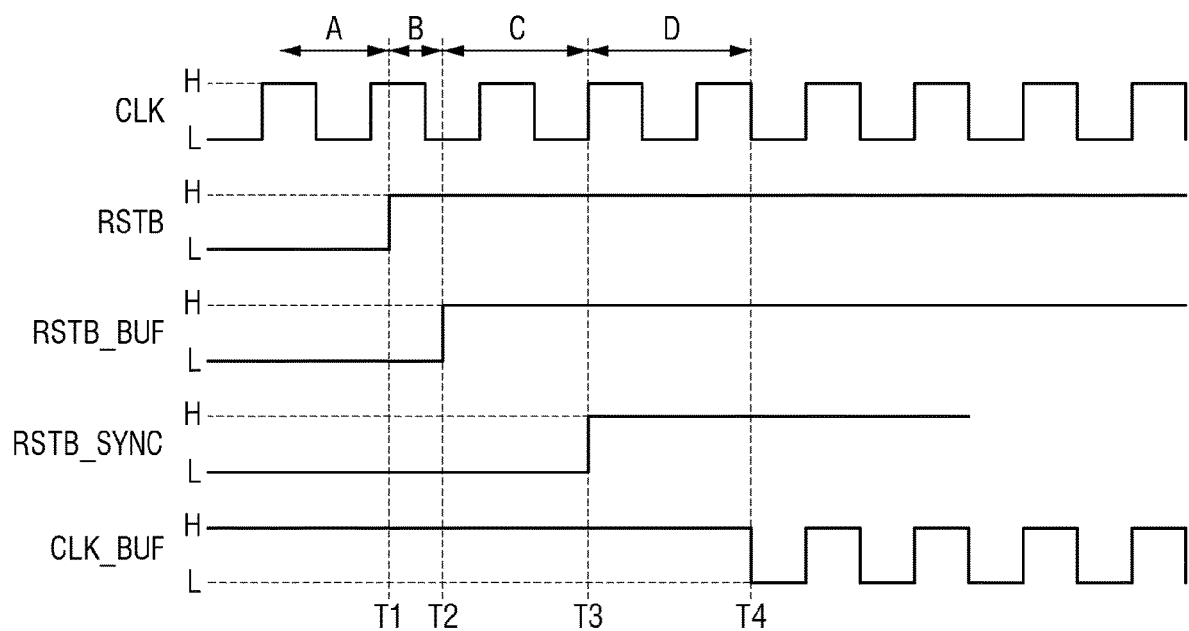
FIG. 9 is a timing diagram for explaining the operation of the clock frequency divider circuit according to example embodiments.

FIG. 9 is a timing diagram for explaining the operation of the clock frequency divider circuit according to example embodiments.

Referring to FIG. 9, after the second reset synchronization signal RSTB_SYNC transitions to the second level H, the first clock buffer signal CLK_BUF may be output in the same form as the first clock signal CLK. For example, the clock buffer signal CLK_BUF may be output at a constant level of the second level H before a fourth time T4 and may be output in the same form as the first clock signal CLK after the fourth time T4.

Specifically, referring to FIG. 4, the second reset synchronization signal RSTB_SYNC may be maintained constant at the first level L before the third time T3. Therefore, the first transistor 216 may be gated by the first reset synchronization signal RST_SYNC of the second level H, and an input terminal of the first inverter 217 may be pulled down. Accordingly, the first clock buffer signal output terminal 218 may output the first clock buffer signal CLK_BUF having the second level H.

When the second reset synchronization signal RSTB_SYNC transitions from the first level L to the second level H at the third time T3, the first transistor 216 may be turned off as the first reset synchronization signal RST_SYNC transitions from the second level H to the first level L. The first clock buffer signal CLK_BUF may be buffered to maintain the existing second level H during a period D.

At the third time T3, as the first reset synchronization signal RST_SYNC transitions from the second level H to the first level L, the first transistor 216 may be turned off. Since the second transistor 213 and the third transistor 215 included in the first tristate buffer 212 are gated by the first reset synchronization signal RST_SYNC and the second reset synchronization signal RSTB_SYNC, respectively, the first tristate buffer 212 may operate as an inverter.

Therefore, the first tristate buffer 212 and the first inverter 217 may operate as buffers to buffer the received first clock signal CLK and output the first clock buffer signal CLK_BUF. Accordingly, the first clock buffer signal CLK_BUF may be output in the same form as the first clock signal CLK from the fourth time T4 after being delayed by the period D after the third time T3.

Figure 10:
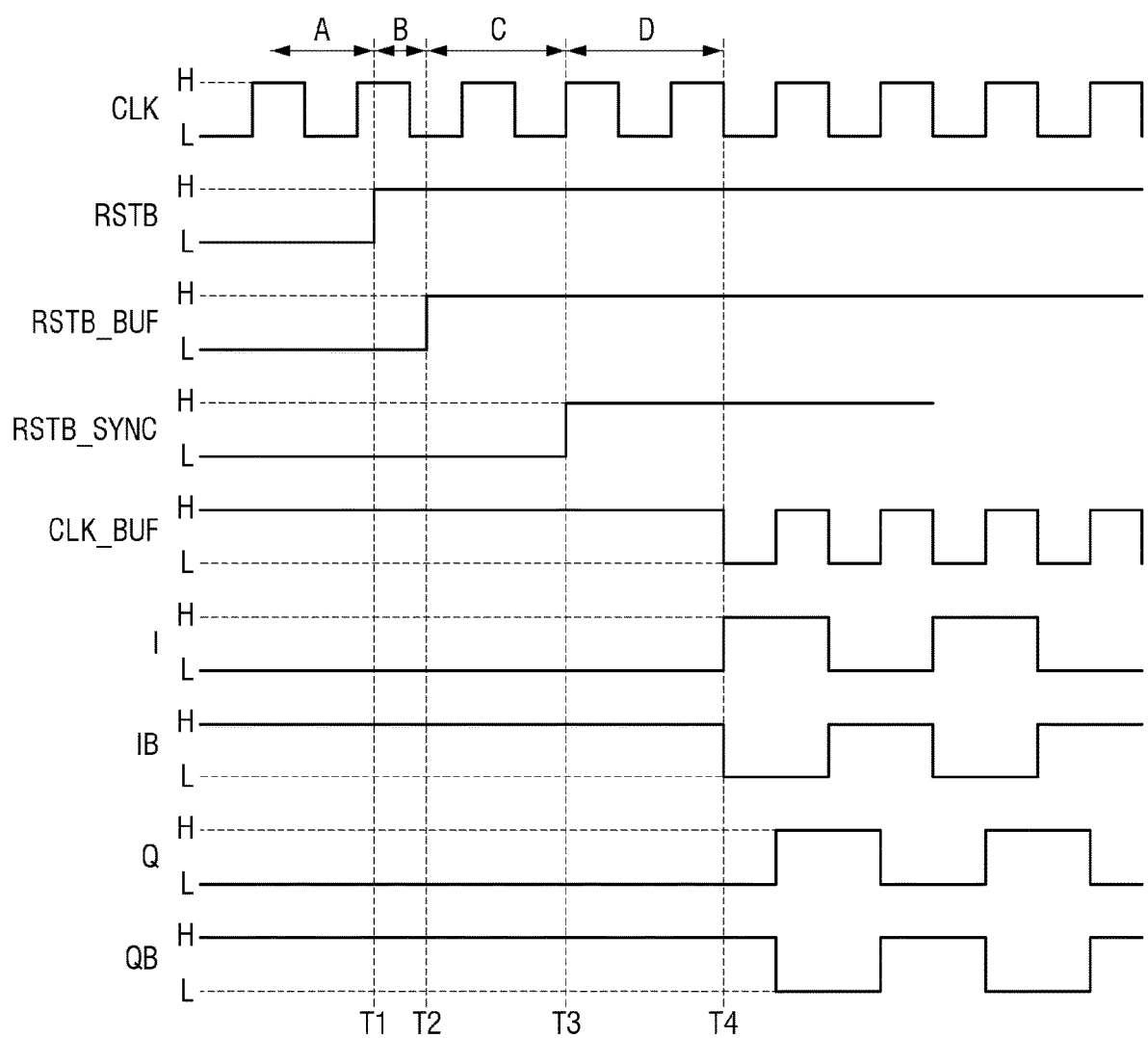
FIG. 10 is a timing diagram for explaining the operation of the clock frequency divider circuit according to example embodiments.

FIG. 10 is a timing diagram for explaining the operation of the clock frequency divider circuit according to example embodiments.

Referring to FIG. 10, in response to the first clock buffer signal CLK_BUF being output in the same form as the first clock signal CLK at the fourth time T4, the first output signal may be output from the output terminal I. Specifically, the first output signal may toggle at a falling edge of the first clock signal CLK, and the second output signal may toggle at a rising edge of the first clock signal CLK. In addition, the third output signal may have a phase opposite to that of the first output signal, and the fourth output signal may have a phase opposite to that of the second output signal.

Specifically, referring also to FIG. 5, in the periods A and B of FIG. 10, the reset buffer signal RST_BUF may be maintained at the second level H, and the second reset buffer signal RSTB_BUF may be maintained at the first level L. Accordingly, the third through sixth switching transistors 350, 360, 370 and 380 may be gated. Therefore, the first output signal I and the second output signal Q may be maintained constant at the first level L, and the third output signal IB and the fourth output signal QB may be maintained constant at the second level H.

In the periods C and D of FIG. 10, the first reset buffer signal RST_BUF may be maintained at the first level L, and the second reset buffer signal RSTB_BUF may be maintained at the second level H. Accordingly, the third through sixth switching transistors 350, 360, 370 and 380 may all be turned off. Also, in the periods C and D, the first clock buffer signal CLK_BUF may maintain the second level H as in the periods A and B, and the second clock buffer signal CLKB_BUF may maintain the first level L as in the periods A and B. Accordingly, the third tristate buffer 310 and the fourth tristate buffer 320 may be in a floating state, and the fifth tristate buffer 330 and the sixth tristate buffer 340 may operate as inverters. Therefore, the first output signal I and the second output signal Q may be maintained constant at the first level L, and the third output signal IB and the fourth output signal QB may be maintained constant at the second level H.

As the first clock buffer signal CLK_BUF and the second clock buffer signal CLKB_BUF start to transition after the fourth time T4, the first through fourth output signals I, Q, IB, and QB may also start to transition. Since the processes of outputting the first through fourth output signals I, Q, IB, and QB are substantially the same, only the process of outputting the first output signal I will be described below.

At the fourth time T4, the first clock buffer signal CLK_BUF transitions from the second level H to the first level L, and the second clock buffer signal CLKB_BUF transitions from the first level L to the second level H. Accordingly, the third tristate buffer 310 may operate as an inverter. Therefore, since a signal corresponding to the first level L is output from the output terminal Q, the first output signal I may transition to the second level H.

Next, when the first clock buffer signal CLK_BUF transitions from the first level L to the second level H and the second clock buffer signal CLKB_BUF transitions from the second level H to the first level L, the third tristate buffer 310 may be in a floating state. Therefore, the first output signal I may maintain the second level H by the first latch 390.

Next, as the first clock buffer signal CLK_BUF transitions from the second level H to the first level L and the second clock buffer signal CLKB_BUF transitions from the first level L to the second level H, the third tristate buffer 310 may operate as an inverter. Therefore, since a signal corresponding to the second level H is output from the output terminal Q, the first output signal I may transition to the first level L.

For example, the third and fourth tristate buffers 310 and 320 may operate as inverters when the received first clock buffer signal CLK_BUF corresponds to the first level L and the second clock buffer signal CLKB_BUF corresponds to the second level H. Similarly, the fifth and sixth tristate buffers 330 and 340 may operate as inverters when the received first clock buffer signal CLK_BUF corresponds to the second level H and the second clock buffer signal CLKB_BUF corresponds to the first level L.

Therefore, the first through fourth output signals I, Q, IB, and QB may have a frequency corresponding to half the frequency of the clock signal CLK. In addition, the first through fourth output signals I, Q, IB, and QB may sequentially have a phase difference of 90 degrees.

Figure 11:
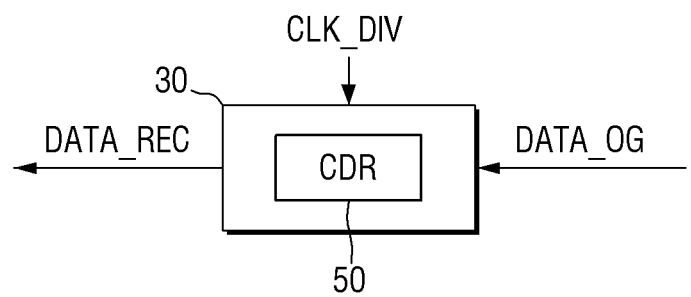
FIG. 11 is a block diagram of a receiver of FIG. 1 according to example embodiments.

FIG. 11 is a block diagram of a receiver of FIG. 1 according to example embodiments.

The receiver 30 may include a clock and data recovery (CDR) unit 50.

The CDR unit 50 may receive the output signal CLK_DIV from the clock frequency divider circuit 10 and receive data DATA_OG. The CDR unit 50 may output recovered data DATA_REC based on the received output signal CLK_DIV and data DATA_OG. For example, the CDR unit 50 may recover the data DATA_OG based on the output signal CLK_DIV received from the clock frequency divider circuit 10.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A clock frequency divider circuit comprising:
   a reset retimer circuit configured to:
   receive a reset signal and a clock signal,
   output a reset buffer signal of a differential signal pair obtained by buffering the reset signal, and
   output a reset synchronization signal obtained by synchronizing the reset signal with the clock signal;
   a clock buffer circuit configured to receive the clock signal and the reset synchronization signal and output a clock buffer signal of a differential signal pair obtained by buffering the clock signal; and
   an IQ divider circuit configured to output first through fourth output signals having different phases based on the reset buffer signal and the clock buffer signal.

2. The clock frequency divider circuit of claim 1, wherein the reset retimer circuit comprises:
   a reset signal input unit configured to receive the reset signal;
   a reset buffer signal output unit which is connected to the reset signal input unit to output the reset buffer signal; and
   a reset synchronization signal output unit which is connected to the reset signal input unit to output the reset synchronization signal,
   wherein the reset buffer signal output unit and the reset synchronization signal output unit are connected in parallel.

3. The clock frequency divider circuit of claim 2, wherein the reset buffer signal comprises a first reset buffer signal and a second reset buffer signal having a phase opposite to the first reset buffer signal, and
   wherein the reset buffer signal output unit comprises:
   a first reset buffer signal output terminal configured to output the first reset buffer signal and provide the first reset buffer signal to the IQ divider circuit;
   a second reset buffer signal output terminal configured to output the second reset buffer signal and provide the second reset buffer signal to the IQ divider circuit;
   a first inverter including an input terminal connected to the reset signal input unit and an output terminal connected to the first reset buffer signal output terminal; and
   a second inverter which is connected in series between the first reset buffer signal output terminal and the second reset buffer signal output terminal.

4. The clock frequency divider circuit of claim 2, wherein the reset synchronization signal comprises a first reset synchronization signal and a second reset synchronization signal having a phase opposite to the first reset synchronization signal, and wherein the reset synchronization signal output unit comprises:
a first reset synchronization signal output terminal which is connected to a first switch and outputs the first reset synchronization signal; and
a second reset synchronization signal output terminal which is connected to a second switch and outputs the second reset synchronization signal,
wherein the first switch and the second switch are synchronized with the clock signal.

5. The clock frequency divider circuit of claim 4, wherein the reset synchronization signal output unit further comprises a latch which is connected between the first reset synchronization signal output terminal and the second reset synchronization signal output terminal.

6. The clock frequency divider circuit of claim 1, wherein the clock buffer signal comprises a first clock buffer signal and a second clock buffer signal having a phase opposite to the first clock buffer signal, and wherein the clock buffer circuit comprises:
a first clock buffer circuit configured to output the first clock buffer signal and provide the first clock buffer signal to the IQ divider circuit; and
a second clock buffer circuit configured to output the second clock buffer signal and provide the second clock buffer signal to the IQ divider circuit.

7. The clock frequency divider circuit of claim 6, wherein the first clock buffer circuit comprises:
a tristate buffer configured to receive the clock signal;
a first inverter including an input terminal connected to an output terminal of the tristate buffer and an output terminal configured to output the first clock buffer signal; and
a first transistor which is connected between the input terminal of the first inverter and a ground voltage,
wherein the tristate buffer and the first transistor are gated by the reset synchronization signal.

8. The clock frequency divider circuit of claim 7, wherein the tristate buffer comprises:
a second inverter;
a second transistor which receives a driving voltage and is connected to the second inverter; and
a third transistor which receives a ground voltage and is connected to the second inverter,
wherein the second and third transistors are gated by the reset synchronization signal.

9. The clock frequency divider circuit of claim 1, wherein a frequency of each of the first through fourth output signals has a value corresponding to half a frequency of the clock signal.

10. The clock frequency divider circuit of claim 1, wherein:
the first output signal toggles at a falling edge of the clock signal,
the second output signal toggles at a rising edge of the clock signal,
the third output signal has a phase opposite to that of the first output signal, and
the fourth output signal has a phase opposite to that of the second output signal.

11. A clock frequency divider circuit comprising:
a reset retimer circuit configured to:
receive a clock signal transitioning between a first level and a second level higher than the first level and a reset signal, and
output a reset buffer signal and a reset synchronization signal;
a clock buffer circuit configured to receive the clock signal and the reset synchronization signal and output a clock buffer signal; and
an IQ divider circuit configured to output first through fourth output signals having different phases based on the reset buffer signal and the clock buffer signal,
wherein the reset signal transitions from the first level to the second level at a first time point,
wherein the reset buffer signal transitions from the first level to the second level at a second time point after the first time point at which the reset signal transitions from the first level to the second level, and
wherein the reset synchronization signal transitions from the first level to the second level in synchronization with the clock signal at a third time point at which the clock signal transitions from the first level to the second level.

12. The clock frequency divider circuit of claim 11, wherein the reset synchronization signal transitions from the first level to the second level after the second time point at which the reset buffer signal transitions from the first level to the second level.

13. The clock frequency divider circuit of claim 11, wherein the clock buffer signal:
maintains the second level before the third time point at which the reset synchronization signal transitions from the first level to the second level,
maintains the second level between the third time point and a fourth time point at which the clock signal transitions from the second level to the first level, and
has the same phase as the clock signal after the fourth time point.

14. The clock frequency divider circuit of claim 13, wherein the first through fourth output signals transition between the first level and the second level after the fourth time point.

15. The clock frequency divider circuit of claim 11, wherein a frequency of each of the output signals has a value corresponding to half a frequency of the clock signal.

16. The clock frequency divider circuit of claim 11, wherein:
the first output signal toggles at a falling edge of the clock signal,
the second output signal toggles at a rising edge of the clock signal,
the third output signal has a phase opposite to that of the first output signal, and
the fourth output signal has a phase opposite to that of the second output signal.

17. A receiver comprising:
a clock and data recovery (CDR) unit configured to receive data from a transmitter and output recovered data based on the received data and first through fourth output signals,
wherein the first through fourth output signals are provided from a clock frequency divider circuit configured to:
receive a reset signal and a clock signal,
generate a reset synchronization signal synchronized with the clock signal, generate a reset buffer signal by buffering the reset signal, generate a clock buffer signal by buffering the clock signal, and output the first through fourth output signals having different phases based on the reset buffer signal and the clock buffer signal, wherein the reset synchronization signal transitions from a first level to a second level higher than the first level after the rest buffer signal transitions from the first level to the second level.

18. The receiver of claim 17, wherein a frequency of each of the output signals has a value corresponding to half a frequency of the clock signal.

19. The receiver of claim 17, wherein:

the first output signal toggles at a falling edge of the clock signal, the second output signal toggles at a rising edge of the clock signal, the third output signal has a phase opposite to that of the first output signal, and the fourth output signal has a phase opposite to that of the second output signal.

\* \* \* \* \*